(12) United States Patent
Cocolios et al.

(10) Patent No.: US 6,458,330 B1
(45) Date of Patent: Oct. 1, 2002

(54) INSTALLATION IN WHICH AN OPERATION IS PERFORMED REQUIRING OVER THE ATMOSPHERE INSIDE A CHAMBER

(75) Inventors: Panayotis Cocolios; François Coeuret, both of Paris Cedex (FR); Wolfgang Döring; Franck Förster, both of Hamburg (DE); Jean-Louis Gelot, Paris Cedex (FR); Bernd Martens, Hamburg (DE); Stéphane Melen, Paris Cedex (FR); Eckhard Prinz, Hamburg (DE); Jean-Yves Thonnelier; Alain Villermet, both of Paris Cedex (FR)

(73) Assignee: L'Air Liquide Societe Anonyme a Directoire et Conseil de Surveillance pour l'Etude et l'Exploitation des Procedes Georges Claude, Paris (FR)

( * ) Notice: Subject to any disclaimer, the term of this patent is extended or adjusted under 35 U.S.C. 154(b) by 0 days.

(21) Appl. No.: 09/738,314

(22) Filed: Dec. 18, 2000

(30) Foreign Application Priority Data

Nov. 16, 2000 (FR) .............................................. 00 14793

(51) Int. Cl.[7] ................................................ B01J 19/08
(52) U.S. Cl. ............................... 422/186.05; 422/186.3; 422/186.04
(58) Field of Search .......................... 422/186.04, 186.3, 422/186.05

(56) References Cited

U.S. PATENT DOCUMENTS 4,209,357 A * 6/1980 Gorin et al. ................. 156/643
5,576,076 A * 11/1996 Slootman et al. ........... 427/579

* cited by examiner

Primary Examiner—Kishor Mayekar
(74) Attorney, Agent, or Firm—Burns, Doane, Swecker & Mathis, L.L.P.

(57) ABSTRACT

Optimization of an installation in which an operation is performed that requires control over the atmosphere inside a chamber (3), the operation being performed in the presence of a gaseous mixture capable of giving off emissions, the optimization being obtained by the presence of inlet (5) and outlet (8) devices external to the chamber to oppose the ingress of air into the chamber and the exit of gaseous emissions; and of an extraction device (4) comprising means (42) for regulating the flow rate to maintain an approximately zero pressure differential between the inside and the outside of the chamber.

33 Claims, 2 Drawing Sheets

INSTALLATION IN WHICH AN OPERATION IS PERFORMED REQUIRING OVER THE ATMOSPHERE INSIDE A CHAMBER

BACKGROUND OF THE INVENTION

1. Field of the Invention

The invention relates to an installation in which an operation is performed that requires control over the atmosphere inside a chamber, and relates in particular to an installation for the surface treatment of a running substrate, particularly a polymer film, more precisely for implementing a method whereby the substrate is subjected to an electrical discharge in a gaseous mixture other than air.

2. Description of Related Art

In particular, it is known that the performance of films (surface energy, adhesion properties, etc.), particularly of polyolefin films, can be improved by depositing a small amount of silicon oxide on their surface. To this end, according to these known methods, the substrate (the film) made of polymer is subjected to an electrical discharge with dielectric barrier at a pressure higher than 10 kPa, and, at the same time or subsequently, the substrate thus treated is exposed to an atmosphere consisting of an active gaseous mixture, the active mixture containing, for example, a gas capable of causing the formation of the silicon oxygen deposit, such as a silane (usually a silicon hydrocarbon which may or may not be halogenated, or an alkoxysilane).

In general, treatment by electrical discharge in a gaseous mixture is performed continuously, at substrate running speeds ranging from about ten to several hundred meters per minute, usually in a chamber containing, in addition to the electrodes, a device for injecting the active gaseous mixture and devices for extracting the gaseous emissions. The discharge is created between the electrodes of the chamber arranged on one side of one of the surfaces of the substrate and a counterelectrode arranged on the side of the opposite surface.

By way of illustration of this state of the art of surface treatments of running polymer films, reference may, for example, be made to document EP-0 622 474.

More specifically, the substrate to be treated is applied against the periphery of a metal roll covered with a dielectric material used as a counterelectrode and grounded, along an arc of a circle of several tens of degrees, for example over half the circumference of the roll. A cap delimiting the chamber covers part of the length of this arc of a circle, approximately centrally, extending far enough away from this arc to be able to contain the various elements necessary for the treatment; the length of the roll in its axial direction is slightly greater than the width of the substrate, and the length of the chamber in the same direction is itself generally slightly greater than the width of the substrate.

Furthermore, on an industrial scale, treatment is often performed constantly 24 hours a day, and the apparatus under the cap has to operate as an open system. In spite of the devices for extracting and injecting the active gaseous mixture, the air entrained as a boundary layer at the surface of the strip cannot be completely prevented from getting under the cap. The treatment is therefore carried out in a gaseous mixture consisting of the active gaseous mixture injected and of air, the proportions of which are poorly controlled.

The active gaseous mixtures employed are generally binary or ternary mixtures consisting of nitrogen by way of carrier gas and of active gases in proportions of the order of a few hundreds of ppm. Work carried out in optimizing the method clearly demonstrates that the level of each of the active gases in the mixture is an essential parameter that needs to be controlled as strictly as possible. Furthermore, certain active gases such as silanes have the property of reacting strongly with air to give byprnducts, particularly solid and gaseous ones.

It is therefore necessary to have use of a treatment installation capable of good control over the treatment gaseous atmosphere, by reducing the amount of incoming air as far as possible.

There are also known (see, for example, the European patent mentioned earlier), installations for implementing such methods comprising injectors for injecting active gaseous mixture right inside the discharge and extraction slits at the inlet and outlet of the chamber. The injection and extraction flow rates are regulated so that the amount of incoming air is minimized. However, minimal air content achieved under the cap remains high by comparison with the content of active gas in the injected mixture. Hence, when the desired treatment level demands that the gaseous mixture contains a very low content of oxidizing gas, uncontrolled addition of a certain amount of air (and therefore oxygen, which is an oxidizing gas) to the gaseous mixture leads to poor control of the quality of the treatment. Control over the composition of the active gaseous mixture may therefore prove insufficient with this type of installation.

The object of the invention is to overcome this drawback and more particularly to provide an improved installation of the aforementioned type (in which an operation is performed that requires control over the atmosphere inside a chamber), and, in the particular case of the surface treatments of running substrates, to propose an installation such that the control and management of the gas are possible both in terms of incoming gases and exiting gases, through the fact that:

the air entrained on the surface of the substrate is prevented from entering the treatment chamber;

the active gaseous mixture is injected into the chamber and thus used optimally for the actual treatment;

any gaseous emissions are collected so that they can be processed before they are rejected to the air.

SUMMARY OF THE INVENTION

To this end, the invention relates first of all to an installation in which an operation is performed that requires control over the atmosphere inside a chamber, the operation being performed in the presence of a gaseous mixture capable of giving off emissions, characterized in that it comprises:

inlet and outlet devices adjoining the chamber to oppose respectively the ingress of air into the chamber and the exit of gaseous emissions therefrom;

an extraction device comprising a duct opening into the chamber; and means for regulating the flow rate of gas drawn out by said extraction device so as to maintain an approximately zero pressure difference between the inside of the chamber and the surrounding atmosphere.

The expression "approximately zero" according to the present invention is to be understood as meaning a pressure difference (positive or negative) not exceeding a few tens of Pa or even 100 Pa. However, it is preferable according to the present invention to work with pressure differences not exceeding 50 Pa or even differences lower than 10 Pa.

The installation according to the invention may also have one or more of the following features:

- the inlet device comprises means for injecting an inert gas forming a gas knife upstream of the chamber, means for creating a raised pressure discharging the inert gas away from the chamber forming a piston preventing air from entering the chamber and means for ducting the air away from the chamber.
- the outlet device comprises means for injecting an inert gas forming a gas knife downstream of the chamber, means for creating a raised pressure discharging the inert gas toward the chamber forming a piston opposing the entrainment of emissions out of the chamber, and means for ducting toward the chamber any emissions that may be trying to leave this chamber.
- said means for injecting the inert gas forming a gas knife comprise a flat-walled gas-injection slit opening to inside the inlet or outlet device concerned.
- said means for creating a raised pressure discharging the gas and forming a piston comprise open grooves facing the interior space of the inlet or outlet device concerned and forming a labyrinth.
- said ducting means comprise a passage separated from said gas-injection means by a partition and open facing the interior space of the inlet or outlet device concerned.
- said ducting means comprise a passage cut into one face of a plate separated from another part by a space forming an inert-gas-injection slit.
- the ratio between the length and the height of the passage is at least equal to 3, preferably at least equal to 6.
- the installation further comprises lateral devices outside the chamber, comprising at least means for creating a raised pressure discharging the gas away from the chamber and forming a piston preventing air from entering the chamber and, as appropriate, also means for injecting an inert gas forming a gas knife to the side of the chamber, and means for ducting the air away from the chamber.
- the installation comprises a second extraction device downstream of the outlet device.
- it comprises a controller for coordinating the operation of all or some of the elements of the installation.
- the controller is capable of optimizing the flow rates of injected gas (whether this is the inert gas or the gaseous mixture used for the actual operation), according to oxygen content readings for evaluating the air intakes taken at various points inside the chamber and/or according to a reading of the differential pressure between the inside of the chamber and the surrounding atmosphere.
- the operation performed in the chamber is an operation of surface-treating a running substrate by an electrical discharge in the presence of said gaseous mixture capable of giving off emissions.
- the operation performed in the chamber is an operation of crosslinking a coating (for example an ink or a varnish) by ultraviolet radiation (known as UV curing) or using an electron beam, in the presence of an inert, for example nitrogen-based gaseous mixture.

The idea of a "gas knife" according to the invention is to be understood as covering, in general, varied gas-injection geometries and therefore not necessarily injections of very narrow shape and extremely high gas speed (as is sometimes to be understood by the expression "knife" in certain literature).

All the features and advantages of the invention will be better understood by examining one of its practical applications, with the case of installations for the surface treatment of a running substrate by an electrical discharge in the presence of a gaseous mixture capable of giving off emissions.

The present invention therefore also relates to an installation for surface-treating a running substrate by an electrical discharge in the presence of a gaseous mixture capable of giving off emissions, comprising a substrate support against a region of which the substrate is applied, and electrodes near the support which forms a counterelectrode, characterized in that it also comprises:

- a chamber adjacent to the support over at least the width of the substrate and along at least part of said region, in which the electrodes are housed;
- inlet and outlet devices adjoining the chamber to oppose respectively the ingress of air into the chamber and the exit of gaseous emissions therefrom;
- an extraction device comprising a duct opening into the chamber; and
- means for regulating the flow rate of gas drawn out by said extraction device so as to maintain an approximately zero pressure difference between the inside of the chamber and the surrounding atmosphere.

By virtue of this design, the chamber is sufficiently isolated from the outside, while at the same time maintaining an open-system operation, so that the installation is capable of treating a substrate running at high speed.

The surface treatment installation according to the invention may further exhibit one or more of the following features:

- the installation comprises a gaseous mixture supply manifold connected to the electrodes to inject the gaseous mixture against the substrate amongst the electrodes.
- the inlet device comprises means for injecting an inert gas against the substrate forming a gas knife upstream of the chamber, means for creating a raised pressure discharging the inert gas away from the chamber forming a piston preventing air from entering the chamber and means for ducting the air away from the chamber.
- the outlet device comprises means for injecting an inert gas against the substrate forming a gas knife downstream of the chamber, means for creating a raised pressure discharging the inert gas toward the chamber forming a piston opposing the entrainment of emissions by the substrate, and means for ducting toward the chamber any emissions that may be trying to leave this chamber.
- it further comprises lateral devices outside the chamber, comprising at least means for creating a raised pressure discharging the gas away from the chamber and forming a piston preventing air from entering the chamber and, as appropriate, also means for injecting an inert gas against the support forming a gas knife to the side of the chamber, and means for ducting the air away from the chamber.
- said means for injecting the inert gas forming a gas knife comprise a flat-walled gas-injection slit opening to the outside opposite the support (the slit advantageously is a few tenths of a millimeter thick).
- said means for creating a raised pressure discharging the gas and forming a piston comprise open grooves facing the support and forming a labyrinth.
- said ducting means comprise a passage separated by a partition from said inert-gas injection means and open facing the support.

said ducting means comprise a passage cut into one face of a plate separated from another part by a space forming an inert-gas-injection slit.

the ratio between the length (in the direction of travel of the substrate) and the height of the passage is at least equal to 3, preferably at least equal to 6.

the substrate support is a rotary roll and the region against which the substrate is applied is a region in the form of an arc of a circle.

the means for regulating the drawn-out flow rate comprise a regulating valve in the extraction duct opening into the chamber, and a control circuit comprising a pressure sensor for controlling the valve.

the means for regulating the drawn-out flow rate comprise means for regulating the rotational speed of the extraction fan (for example, of the frequency variator or potentiometer type) and a control circuit comprising a pressure sensor for controlling the rotational speed of the extraction fan.

it comprises a controller for coordinating the operation of all or some of the elements of the installation.

the controller is capable of optimizing the flow rates of injected gas (whether this be the inert gas or the gaseous mixture used for the actual surface treatment), according to oxygen content readings for evaluating the air inlets taken at various points inside the chamber and/or according to a reading of the differential pressure between the inside of the chamber and the surrounding atmosphere.

it comprises a second extraction device downstream of the outlet device.

the electrodes are connected to a so-called high-voltage and high-frequency power supply.

Further features and advantages of the invention will emerge from the description which will follow, of one embodiment of the invention which is given by way of non-limiting example, illustrated by the appended drawings in which:

DESCRIPTION OF PREFERRED EMBODIMENTS

The installation illustrated in the figures comprises a support roll 1 forming a counterelectrode which is grounded, against part of the periphery of which a substrate S to be treated, for example a polyolefin strip, is applied; in this instance, the strip is applied against the periphery of the roll along an arc of a circle of about 180°.

Figure 1:
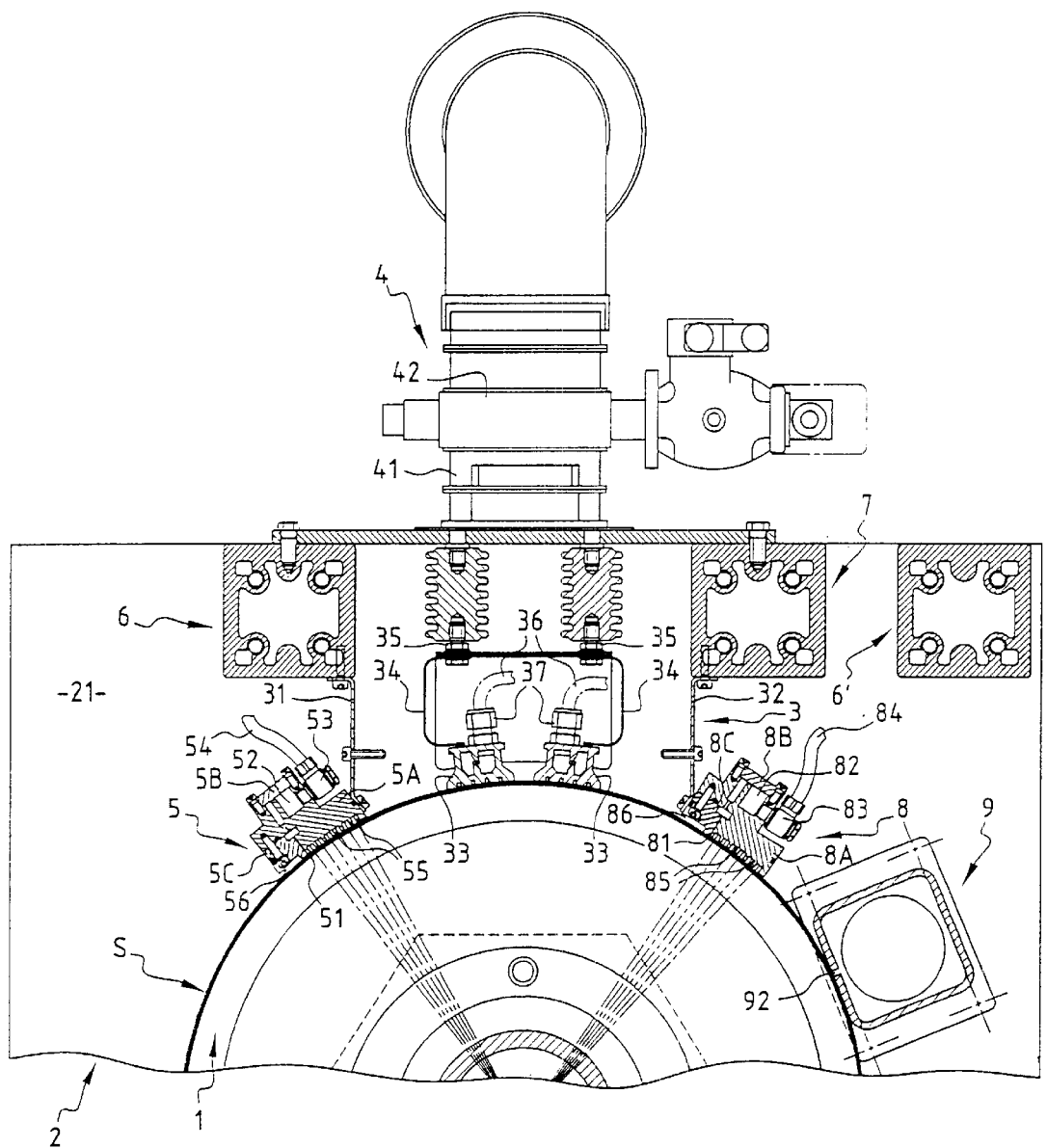
FIG. 1 is a diagrammatic side view of part of a surface treatment installation according to the invention, in which certain elements of the installation are shown in at least partial section.

The roll 1 is housed over its entire length in a casing comprising a front plate 21 and a rear plate 21' (FIG. 1 shows only the vertical front plate 21), the plates 21 and 21' being secured by a system of beams 6, 7, 6' which will be detailed later on in the context of the present description.

FIG. 1 also shows the presence of a chamber 3 adjacent to the roll 1 and extending between the beams 6 and 7, secured to the front and rear plates 21 and 21' along a generatrix thereof situated approximately centrally on the arc over which the substrate S is applied against the roll, over at least the entire width of the substrate. This chamber 3 itself comprises two longitudinal walls 31, 32 roughly parallel to the radial plane of the roll containing the central generatrix of said arc, and is open over its entire length along the part of this arc over which it extends; the substrate S runs along the base of the chamber 3 where it is brought into contact with the active gaseous mixture, the resulting gaseous emissions having then to be discharged from the chamber by means of an extraction device 4 to avoid them being rejected into the atmosphere.

However, since the extraction creates a reduced pressure in the chamber, and the system is an open system, this reduced pressure will cause a stream of air proportional to the pressure difference between the outside (high pressure close to one atmosphere) and the inside (low pressure due to the extraction) to enter the chamber unless special precautions are taken.

Thus, to control the atmosphere in the chamber and, more precisely, to maintain the pressure in the chamber at a value approximately identical to that obtaining outside in spite of the reduced pressure due to the ventilation, it is essential to be able to manage both the gases entering the chamber and the gases leaving it.

Hence, the installation according to the invention comprises, as will be seen, adjoining the chamber 3, elements external to the chamber, on the one hand, on the substrate inlet side thereof and on the substrate outlet side, and, on the other hand, on the side thereof. It also comprises elements inside the chamber, particularly with at least one extraction device.

The main purpose of the elements external to the chamber on the substrate inlet side is to prevent the ingress of air into the chamber, using a stream of gas that is inert under the working conditions, such as nitrogen, while at the same time minimizing the consumption of this inert gas.

Figure 2:
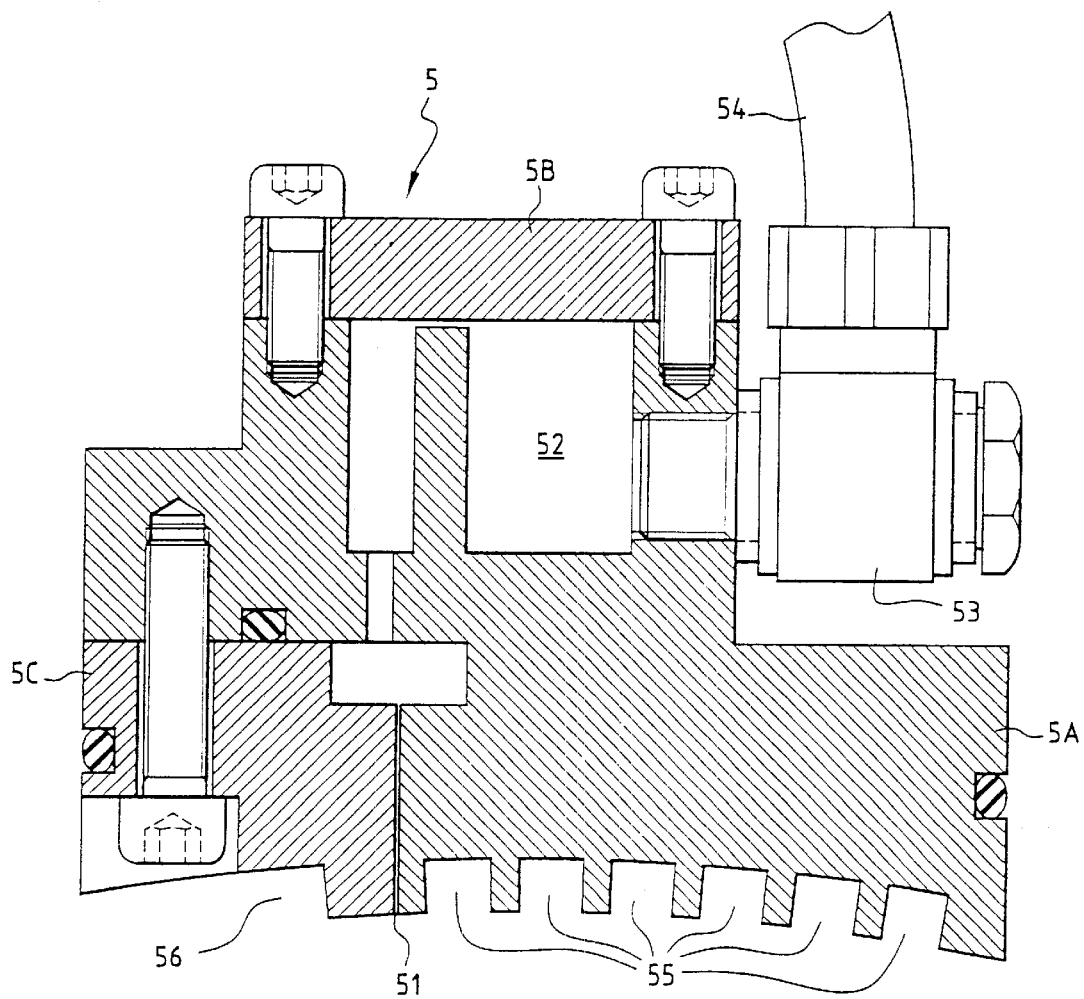
FIG. 2 is a diagrammatic side view of one of the devices equipping the installation of FIG. 1.

To this end, an inlet unit 5 (FIG. 2) extending across the entire length of the chamber 3 is fixed to the base of a metal sheet constituting the lower part of the longitudinal wall 31 of the chamber 3 on the inlet side; this inlet unit 5 is distant from the substrate S by sufficient distance for there to be no rubbing of the substrate against its base.

The unit 5 comprises a flat-walled nitrogen-injection slit 51 extending in the longitudinal and radial directions of the roll 1 and having a width in this instance of a few tenths of a millimeter (typically 0.3 to 0.5 millimeter) opening to the outside opposite the roll and thus the substrate upstream of the inlet to the chamber 3, and the length of which is at least equal to the width of the substrate.

The unit 5 comprises a nitrogen introduction chamber 52 connected to the slit 51 by a series of nitrogen transmission passages and into which the nitrogen supply connectors 53 fixed to the unit 5 and following on from each other along the latter open; these connectors are connected by respective ducts 54 to a nitrogen supply manifold 6 fixed to the upper part of the metal sheet 31 and to the upper part of the plates 21 and 21', of which manifold one wall, in the upward continuation of the metal sheet 31, constitutes the upper part of the longitudinal wall of the chamber 3.

The nitrogen supply manifold 6 is connected to a nitrogen source by means of a duct which is not depicted in the drawings.

Furthermore, the inlet unit 5 comprises, downstream of the slit 51, several grooves 55 a few millimeters deep extending longitudinally in the unit, open opposite the roll 1 and thus opposite the substrate S, following on from each other in the direction of travel of the substrate; these grooves, located near the slit 51, separated from the latter and from each other by thin partitions, form a labyrinth and create a zone of raised pressure in the direction of travel of the substrate, which discharges the nitrogen further upstream by forming a piston for the air stream that is to be prevented from entering.

In addition, the inlet unit 5 comprises, upstream of the slit 51, a passage 56, advantageously a few millimeters deep extending longitudinally in the unit, open opposite the roll and thus opposite the substrate and opening to the outside upstream of the unit. This passage extends in the direction of travel of the substrate to the immediate vicinity of the slit 51 from which it is separated by a thin partition; by simultaneously ducting the air stream entering under the unit and the stream of nitrogen from the slit, it improves the nitrogen piston effect so that it pushes the incoming air stream back upstream even more effectively.

According to a preferred implementation of the invention, the ratio between the length (in the direction of travel of the substrate) and the height of the passage 56 is at least equal to 3, but is more preferably at least equal to 6.

Such preferential sizing proves to be entirely advantageous in creating an effective piston effect toward the outside, particularly, in all probability, to detach (and push back) the boundary layer of air transported by the substrate S. The combination of the slit 51, of the labyrinth formed by the grooves 55, and of the passage 56 effectively prevents the air entrained by the film from entering the chamber 3, while at the same time minimizing the nitrogen consumption.

From the practical point of view, the inlet unit 5 is produced, according to the embodiment depicted here, in three parts 5A, 5B, 5C assembled by screws; machined in a first of these parts 5A are the nitrogen transmission passages, orifices in which the nitrogen supply connectors 53 are mounted, and the grooves 55; a second part 5B fits atop the previous one and constitutes a wall of some of the transmission passages and of the nitrogen introduction chamber thereof; a third part 5C is a plate in one face of which the passage 56 is cut and which is separated from the first part 5A by a few tenths of a millimeter so that the space between the two parts 5A, 5C forms a nitrogen injection slit 51.

Although, when referring to the direction of travel of the substrate S, the lateral gaseous transfers (mixtures of active gases and/or air) between the inside and the outside of the chamber 3 are small, it is preferable for exchanges in these directions also to be reduced as far as possible so as to preserve control over the atmosphere in the treatment zone. To this end, each of the lateral walls of the chamber 3 advantageously carries elements similar to those which have just been described, in particular a lateral unit outside the chamber, similar to the inlet unit 5 and which, for that reason, will not be described in detail.

Each lateral unit extends in an arc of a circle around the support roll 1, at least from one longitudinal wall 31 of the chamber 3 to the other 32; it comprises a nitrogen knife injection slit extending in the form of a segment of a circular annulus and opening opposite the roll, connected, like the slit 51 of the inlet unit 5, by passages, a nitrogen introduction chamber and a supply duct, to the nitrogen supply manifold 6; it also comprises several grooves a few millimeters deep, also extending in the shape of a segment of a circular annulus and open opposite the roll, following on from one another in the direction of the lateral edge of the substrate between the nitrogen injection slit and the lateral wall of the chamber 3; it also comprises, on the side of the slit opposite the one on which the grooves extend, a passage a few millimeters deep extending circumferentially into the unit, open opposite the roll and opening to the outside away from the cavity 3.

Furthermore, the main purpose of the elements inside the chamber 3 is to inject the treatment gaseous mixture into the zone where the substrate S is to be subjected to the electrical discharge, while at the same time minimizing the injected gas consumption. To this end, in the embodiment illustrated in FIGS. 1 and 2, the chamber 3 contains two electrodes 33 arranged symmetrically on each side of the central longitudinal plane of the chamber containing the central generatrix of the arc that the substrate forms against the roll. These electrodes, each connected by an electrical conductor 34 to a power supply terminal 35, itself connected to a high-voltage and high-frequency power supply, also serve to inject the active gaseous mixture and are connected for this purpose by respective ducts 36 to an active gaseous mixture supply manifold 7.

By virtue of the fact that the treatment active gaseous mixture is injected through an injection slit located amongst the electrodes 33 directly into the discharge zone, all the injected gas passes through the discharge which reduces possible losses in this region to nil; it is thus possible, by means of constant renewal, to keep the composition of the mixture needed to obtain the desired quality of treatment in the optimized way.

More specifically, the electrodes 33 are metal or ceramic units extending over the entire length of the chamber 3 and fixed thereto. The units each comprise a chamber for the introduction of active gaseous mixture, which chamber is connected to injection slits by active gaseous mixture transmission passages, and into which chamber active gaseous mixture supply connectors 37 fixed into the unit and following on from one another along the latter open, to which connectors the supply ducts 36 are connected. The injection slits, a few tenths of a millimeter in depth, extend longitudinally in the unit and are open opposite the substrate, following on from one another in the direction of travel of this substrate.

The active gaseous mixture supply manifold 7 is arranged symmetrically with respect to the nitrogen supply manifold 6 with respect to the central longitudinal plane of the chamber 3; one wall of this manifold 7, in the upward continuation of the metal sheet, constitutes the upper part of the corresponding longitudinal wall 32 of the chamber 3; the active gaseous mixture supply manifold 7 is connected to an active gaseous mixture source by means of a duct, not depicted.

The main purpose of the elements outside the chamber on the substrate S exit side, is to prevent the gaseous emissions created by the discharge from exiting freely into the atmosphere.

To this end, the gaseous emission extraction device 4 is fixed also externally to the chamber 3, above the latter with which it communicates via an opening in the upper wall of the chamber constituting its exit for the gaseous emissions; this extraction device, compensating in terms of pressure for the various injections of gas (treatment gaseous mixture injected into the discharge zone, all or some of the nitrogen injected in the inlet and exit knives, etc.), and in this instance in the embodiment depicted directs the emissions toward an adsorbent treatment bed apparatus (not depicted).

More specifically, the gaseous emission extraction device 4 comprises an extraction duct 41, fixed to the upper partition of the chamber and opening into the latter, a regulating valve 42, for example of the butterfly valve type, arranged in the extraction duct, and a control circuit (not depicted in the drawings) comprising a differential pressure sensor for evaluating the pressure difference between the inside of the chamber and the surrounding atmosphere, so as to cause the regulating valve 42 to open or close according to the value of the differential pressure recorded by the sensor.

According to an alternative form of the invention, the extraction flow rate itself (rotation of the fan) is altered according to the measured differential pressure.

By virtue of the control circuit if, as a function of the extraction flow rate used and of the injected total flow rate, either a reduced pressure or a raised pressure is created inside the chamber 3, by comparison with the pressure of the surrounding atmosphere, the extraction flow rate is regulated according to the differential pressure so that this differential pressure is as low as possible, and so that the gaseous exchanges with the outside of the chamber (ingress of air or outlet of emissions) are thus minimized.

Furthermore, the running substrate S entraining a boundary layer of gas on its surface, the gas being made up essentially of emissions resulting from the discharge, it is necessary, for safety reasons associated with the nature of the emissions, to detach this boundary layer and keep it inside the chamber 3 so extraction device 4 described above.

To do that, elements similar to those found at the inlet of the chamber are employed at its outlet. An outlet unit 8 extending over the entire length of the chamber 3 is fixed to the base of the metal sheet constituting the lower part of the longitudinal wall 32 of the chamber on the outlet side; this outlet unit 8 comprises a flat-walled nitrogen-injection slit 81 extending in the longitudinal and radial directions of the roll 1 and a few tenths of a millimeter thick (typically 0.3 to 0.5 millimeters thick), opening to the outside opposite the roll and thus opposite the substrate downstream of the outlet from the chamber 3, and the length of which is at least equal to the width of the substrate; the outlet unit 8 comprises a nitrogen introduction chamber 82 connected to the slit 81 by a succession of nitrogen transmission passages and into which chamber nitrogen supply connectors 83 fixed into the unit 8 and following on from one another along the latter open; these connectors are connected by respective ducts 84 to a nitrogen supply manifold 6' fixed to the outside of the cavity 3; this nitrogen supply manifold 6' is connected to the nitrogen source by means of a duct, not depicted.

Furthermore, the outlet unit 8 comprises, downstream of the slit, several grooves 85 several millimeters deep extending longitudinally in the unit, open opposite the roll and thus opposite the substrate, following on from each other in the direction of travel of the substrate; these grooves, located near the slit, separated from the latter and from each other by thin partitions, form a labyrinth and create a zone of raised pressure discharging the nitrogen further upstream by forming a piston opposing the entrainment by the substrate to the outside of the emissions contained in the chamber.

In addition, the outlet unit 8 comprises, upstream of the slit 81, a passage 86, also a few millimeters deep, extending longitudinally in the unit, open opposite the roll and thus opposite the substrate and opening to upstream of the unit on the outlet of the chamber for the substrate; this passage 86 extends in the direction of travel of the substrate to the immediate vicinity of the slit 81 from which it is separated by a thin partition. Thus, the outlet unit 8, in practical terms constructed like the inlet unit 5 and which will therefore not be described further, combines a plate 86 ducting the emissions and optimizing the piston effect, a nitrogen knife, and a labyrinth discharging the nitrogen toward the chamber so as to establish the piston effect against the emissions.

Finally, as an additional safety measure, downstream of the outlet unit 8 in this instance there is a second extraction device 9 intended to collect any residual gaseous emissions. This second extraction device 9 comprises, as was the case with the device 4, a duct and an extraction fan. The duct, having a cross section of square overall shape, has its longitudinal axis parallel to that of the roll 1 and is arranged in close proximity to the substrate S; the lateral wall of this duct, the length of which is at least equal to the width of the substrate, along the entire width of the substrate has a slit 92 passing right through it and is closed at one of its ends while its opposite end is connected to the extraction fan (not depicted), capable of ensuring a flow rate of several hundred cubic meters per hour.

A controller (not depicted) coordinates the operation of all or some of the elements of the installation so as to perfectly optimize the flow rates of inert gas injected.

According to one of the embodiments of the invention, the values of the flow rates of inert gas are set by a regulating loop in which the regulating signal depends on oxygen content readings for evaluating the air intakes taken at various points inside the chamber 3.

As was seen earlier, according to one alternative form of the invention, use is made of a differential pressure sensor for evaluating the pressure difference between the inside of the chamber and the surrounding atmosphere so as, via the controller, to cause the regulating valve 42 to open or to close according to the value of the differential pressure measured by the sensor.

According to another alternative form of the invention, the extraction flow rate is altered, via the rotation of the extraction fan, according to the differential pressure measured.

By way of illustration, it has been possible, according to the invention, in the case of a chamber for the surface treatment of polypropylene films, to obtain the following results under the following operating conditions:

in a 1st example: a polypropylene film width of 1.80 m, the film running at 90 m/minute, a nitrogen knife flow rate at inlet of 25 m$^3$/h, and a nitrogen knife flow rate at outlet of 5 m$^3$/h, a passage length-to-height ratio of 6, for an injection of 60 m$^3$/h of treatment gaseous mixture (in this instance nitrogen).

For this first example, a pressure difference between the inside of the chamber and the surrounding atmosphere of +1 Pa was obtained, with less than 100 ppm of residual oxygen in the chamber.

for a 2nd example: a polypropylene film width of 1.80 m, the film running this time at 300 m/minute, a nitrogen knife flow rate at inlet of 60 m$^3$/h, and a nitrogen knife flow rate at outlet of 10 m$^3$/h, a passage length-to-height ratio in this instance also of 6, for an injection of 30 m$^3$/h of treatment gaseous mixture (in this instance nitrogen).

For this second example, a pressure difference between the inside of the chamber and, here also, the surrounding atmosphere of +1 Pa was obtained, with less than 100 ppm of residual oxygen in the chamber.

What is claimed is:

1. Installation in which an operation is performed that requires control over the atmosphere inside a chamber, the operation being performed in the presence of a gaseous mixture capable of giving off emissions, comprising:

inlet and outlet devices adjoining the chamber to oppose respectively the ingress of air into the chamber and the exit of gaseous emissions therefrom;

an extraction device comprising a duct opening into the chamber; and means for regulating the flow rate of gas drawn out by said extraction device to maintain an approximately zero pressure difference between the inside of the chamber and the surrounding atmosphere.

2. Installation according to claim 1, wherein the inlet device comprises means for injecting an inert gas forming a gas knife upstream of the chamber, means for creating a raised pressure discharging the inert gas away from the chamber forming a piston preventing air from entering the chamber and means for ducting the air away from the chamber.

3. Installation according to claim 2, wherein said means for injecting the inert gas forming a gas knife comprise a flat-walled gas-injection slit opening to inside the inlet or outlet device concerned.

4. Installation according to claim 2, wherein said means for creating a raised pressure discharging the gas and forming a piston comprise open grooves facing the interior space of the inlet or outlet device concerned and forming a labyrinth.

5. Installation according to claim 2, wherein said ducting means comprise a passage separated from said gas-injection means by a partition and open facing the interior space of the inlet or outlet device concerned.

6. Installation according to claim 5, wherein the ratio between the length and the height of the passage is at least equal to 3.

7. Installation according to claim 6, wherein the ratio between the length and the height of the passage is at least equal to 6.

8. Installation according to claim 2, wherein said ducting means comprise a passage cut into one face of a plate separated from another part by a space forming an inert-gas-injection slit.

9. Installation according to claim 1, wherein the outlet device comprises means for injecting an inert gas forming a gas knife downstream of the chamber, means for creating a raised pressure discharging the inert gas toward the chamber forming a piston opposing the entrainment of emissions out of the chamber, and means for ducting toward the chamber any emissions that may be trying to leave this chamber.

10. Installation according to claim 1, further comprising lateral devices outside the chamber, comprising at least means for creating a raised pressure discharging the gas away from the chamber and forming a piston preventing air from entering the chamber and, as appropriate, also means for injecting an inert gas forming a gas knife to the side of the chamber, and means for ducting the air away from the chamber.

11. Installation according to claim 1, further comprising a second extraction device downstream of the outlet device.

12. Installation according to claim 1, further comprising a controller for coordinating the operation of all or some of the elements of the installation.

13. Installation according to claim 12, wherein the controller is capable of optimizing the flow rates of injected gas, inert gas and/or gaseous mixture used for said operation, according to oxygen content readings for evaluating the air intakes taken at various points inside the chamber and/or according to a reading of the differential pressure between the inside of the chamber and the surrounding atmosphere.

14. Installation according to claim 1, wherein the operation performed in the chamber is an operation of surface-treating a running substrate by an electrical discharge in the presence of said gaseous mixture capable of giving off emissions.

15. Installation according to claim 1, wherein the operation performed in the chamber is an operation of crosslinking a coating by ultraviolet radiation (known as UV curing) or using an electron beam, in the presence of an inert gaseous mixture.

16. Installation for surface-treating a running substrate (S) by an electrical discharge in the presence of a gaseous mixture capable of giving off emissions, comprising a substrate support against a region of which the substrate is applied, and electrodes near the support which forms a counterelectrode, a chamber adjacent the support over at least the width of the substrate and along at least part of said region, in which the electrodes are housed;

inlet and outlet devices adjoining the chamber to oppose respectively the ingress of air into the chamber and the exit of gaseous emissions therefrom;

an extraction device comprising a duct opening into the chamber; and means for regulating the flowrate of gas drawn out by said extraction device to maintain an approximately zero pressure difference between the inside of the chamber and the surrounding atmosphere.

17. Surface treatment installation according to claim 16, further comprising a gaseous mixture supply manifold connected to the electrodes to inject the gaseous mixture against the substrate amongst the electrodes.

18. Surface treatment installation according to claim 16, herein the inlet device comprises means for injecting an inert gas against the substrate forming a gas knife upstream of the chamber, means for creating a raised pressure discharging the inert gas away from the chamber forming a piston preventing air from entering the chamber and means for ducting the air away from the chamber.

19. Surface treatment installation according to claim 18, wherein said means for injecting the inert gas forming a gas knife comprise a flat-walled gas-injection slit opening to the outside opposite the support.

20. Installation according to claim 18, wherein said means for creating a raised pressure discharging the gas and forming a piston comprise open grooves facing the support and forming a labyrinth.

21. Surface treatment installation according to claim 18, wherein said ducting means comprise a passage separated by a partition from said inert-gas injection means and open facing the support.

22. Surface treatment installation according to claim 21, wherein the ratio between the length (in the direction of travel of the substrate) and the height of the passage is at least equal to 3.

23. Surface treatment installation according to claim 22, wherein the ratio between the length (in the direction of travel of the substrate) and the height of the passage is at least equal to 6.

24. Surface treatment installation according to claim 18, wherein said ducting means comprise a passage cut into one face of a plate separated from another part b a space forming an inert-gas-injection slit.

25. Surface treatment installation according to claim 18, wherein the substrate support is a rotary roll and the region against which the substrate is applied is a region in the form of an arc of a circle.

26. Surface treatment installation according to claim 16 wherein the outlet device comprises means for injecting an insert gas against the substrate forming a gas knife downstream of the chamber, means for creating a raised pressure discharging the inert gas toward the chamber forming a piston opposing the entrainment of emissions by the substrate, and means for ducting toward the chamber any emissions that may be trying to leave the chamber.

27. Surface treatment installation according to claim 16, further comprising lateral devices outside the chamber, comprising at least means for creating a raised pressure discharging the gas away from the chamber and forming a piston preventing air from entering the chamber and, as appropriate, also means for injecting an inert gas against the support forming a gas knife to the side of the chamber, and means for ducting the air away from the chamber.

28. Surface treatment installation according to claim 16, wherein the means for regulating the drawn-out flow rate comprise a regulating valve in the extraction duct opening into the chamber, and a control circuit comprising a pressure sensor for controlling the valve.

29. Surface treatment installation according to claim 16, wherein the means for regulating the drawn-out flow rate comprise means for regulating the rotational speed of the extraction fan and a control circuit comprising a pressure sensor for controlling the rotational speed of the extraction fan.

30. Surface treatment installation according to claim 16, further comprising a controller for coordinating the operation of all or some of the elements of the installation.

31. Surface treatment installation according to claim 30, wherein the controller is capable of optimizing the flow rates of injected gas, inert gas and/or gaseous mixture for treatment, according to oxygen content readings for evaluating the air intakes taken at various points inside the chamber and/or according to a reading of the differential pressure between the inside of the chamber and the surrounding atmosphere.

32. Surface treatment installation according to claim 16, further comprising a second extraction device downstream of the outlet device.

33. Surface treatment installation according to claim 16, wherein the electrodes are connected to a high-voltage and high-frequency power supply.

* * * * *